US011462415B2

(12) United States Patent
Zhou (10) Patent No.: US 11,462,415 B2
(45) Date of Patent: Oct. 4, 2022

(54) METHODS FOR POLISHING DIELECTRIC LAYER IN FORMING SEMICONDUCTOR DEVICE

(71) Applicant: YANGTZE MEMORY TECHNOLOGIES CO., LTD., Wuhan (CN)

(72) Inventor: Xiaohong Zhou, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 17/162,980

(22) Filed: Jan. 29, 2021

(65) Prior Publication Data

US 2022/0199416 A1 Jun. 23, 2022

Related U.S. Application Data

(63) Continuation of application No. PCT/CN2020/138573, filed on Dec. 23, 2020.

(51) Int. Cl.
*H01L 21/3105* (2006.01)
*B24B 1/00* (2006.01)
(Continued)

(52) U.S. Cl.
CPC .......... *H01L 21/31053* (2013.01); *B24B 1/00* (2013.01); *B24B 37/044* (2013.01);
(Continued)

(58) Field of Classification Search
None
See application file for complete search history.

(56) References Cited

U.S. PATENT DOCUMENTS

2007/0007246 A1* 1/2007 Idani ................ H01L 21/02065
438/692
2008/0202037 A1 8/2008 Oswald et al.
(Continued)

FOREIGN PATENT DOCUMENTS

CN 1774316 A 5/2006
CN 109075172 A 12/2018
(Continued)

OTHER PUBLICATIONS

International Search Report issued in corresponding International Application No. PCT/CN2020/138573, dated Sep. 27, 2021, 4 pages.

*Primary Examiner* — Jiong-Ping Lu
(74) *Attorney, Agent, or Firm* — Bayes PLLC (57) ABSTRACT

Methods for polishing dielectric layers using an auto-stop slurry in forming semiconductor devices, such as three-dimensional (3D) memory devices, are provided. For example, a stack structure is formed in a staircase region and a core array region. The stack structure includes a plurality of interleaved first material layers and second material layers. Edges of the interleaved first material layers and second material layers define a staircase structure on a side of the stack structure in the staircase region. A dielectric layer is formed over the staircase region and a peripheral region outside the stack structure. The dielectric layer includes a protrusion from the stack structure. The dielectric layer is polished using an auto-stop slurry to remove the protrusion of the dielectric layer.

20 Claims, 9 Drawing Sheets

(51) Int. Cl.
    *B24B 37/04*     (2012.01)
    *C09K 3/14*     (2006.01)
    *C09G 1/00*     (2006.01)
    *C09G 1/06*     (2006.01)
    *C09G 1/02*     (2006.01)
    *C09G 1/04*     (2006.01)
    *C09K 13/06*     (2006.01)
    *H01L 21/321*     (2006.01)
    *H01L 21/306*     (2006.01)

(52) U.S. Cl.
    CPC ................ *C09G 1/00* (2013.01); *C09G 1/02* (2013.01); *C09G 1/04* (2013.01); *C09G 1/06* (2013.01); *C09K 3/1454* (2013.01); *C09K 13/06* (2013.01); *H01L 21/30625* (2013.01); *H01L 21/3212* (2013.01)

(56) References Cited

U.S. PATENT DOCUMENTS

| | | |
|---|---|---|
| 2013/0112914 A1 | 5/2013 | Han et al. |
| 2018/0108671 A1 | 4/2018 | Yu et al. |
| 2018/0244956 A1* | 8/2018 | Hains ................ H01L 21/31053 |
| 2019/0206727 A1* | 7/2019 | Matovu ............. H01L 21/76811 |

FOREIGN PATENT DOCUMENTS

| | | |
|---|---|---|
| CN | 109314114 A | 2/2019 |
| CN | 110010609 A | 7/2019 |

* cited by examiner

METHODS FOR POLISHING DIELECTRIC LAYER IN FORMING SEMICONDUCTOR DEVICE

CROSS-REFERENCE TO RELATED APPLICATIONS

This application is continuation of International Application No. PCT/CN2020/138573, filed on Dec. 23, 2020, entitled "METHODS FOR POLISHING DIELECTRIC LAYER IN FORMING SEMICONDUCTOR DEVICE," which is hereby incorporated by reference in its entirety.

BACKGROUND

The present disclosure relates to semiconductor fabrication methods.

Chemical mechanical polishing (CMP, a.k.a. chemical mechanical planarization) is a process of smoothing wafer surface with the combination of chemical etching and free abrasive mechanical polishing. Mechanical grinding alone causes too much surface damage, while wet etching alone cannot attain good planarization. Most chemical reactions are isotropic and etch different crystal planes with different speeds. CMP involves both processes at the same time.

In semiconductor fabrication, the CMP process is used to planarize dielectrics, polysilicon, or metal layers (e.g., copper, aluminum, tungsten, etc.) in order to prepare them for the following lithographic step, avoiding depth focus problems during illumination of photosensitive layers. It is the preferred planarization step utilized in deep sub-micron semiconductor device manufacturing.

SUMMARY

In one aspect, a method for forming a three-dimensional (3D) memory device is disclosed. A stack structure is formed in a staircase region and a core array region. The stack structure includes a plurality of interleaved first material layers and second material layers. Edges of the interleaved first material layers and second material layers define a staircase structure on a side of the stack structure in the staircase region. A dielectric layer is formed over the staircase region and a peripheral region outside the stack structure. The dielectric layer includes a protrusion from the stack structure. The dielectric layer is polished using an auto-stop slurry to remove the protrusion of the dielectric layer.

In another aspect, a method for forming a 3D memory device is disclosed. A dielectric layer is formed over a peripheral region, a core array region, and a staircase region between the peripheral region and the core array region, such that a top surface of the dielectric layer is elevated from the peripheral region through the staircase region to the core array region. Part of the dielectric layer over the core array region is removed. An auto-stop slurry is applied directly onto the top surface of the dielectric layer. A down force is applied to the auto-stop slurry directly on the top surface of the dielectric layer to polish the dielectric layer.

In still another aspect, a method for forming a semiconductor device is disclosed. A dielectric layer is deposited over a semiconductor structure and an area outside and below the semiconductor structure. A side of the semiconductor structure is sloped. Part of the dielectric layer is removed to expose a planar top surface of the semiconductor structure, such that a topography of the dielectric layer includes a protrusion right above the sloped side of the semiconductor structure, and a step height above the top surface of the semiconductor structure. The dielectric layer is polished using an auto-stop slurry until the protrusion and the step height of the topography of the dielectric layer are flattened.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

In fabricating 3D memory devices, such as 3D NAND memory devices, the top surface of a topographic dielectric layer (e.g., a silicon oxide layer) needs to be planarized by CMP. For example, after forming the staircase structure at the side of an elevated stack structure, a dielectric layer, such as a tetraethyl orthosilicate (TEOS) silicon oxide layer, is deposited to cover the staircase structure as well as other areas of the stack structure (e.g., the core array region) and the down area outside and below the elevated stack structure. Due to the height variances of different regions covered by the deposited dielectric layer, protrusion(s) and step height(s) may appear in the topography of the dielectric layer, which need to be removed by CMP prior to subsequent processes applied to the stack structure, for example, forming channel structures through the stack structure.

Conventionally, a high selectivity slurry (HSS) in combination with a stop layer are used in CMP for polishing the above-mentioned topographic dielectric layer covering a staircase structure. The high selectivity slurry used for polishing dielectric layers has a high selectivity of silicon oxide over silicon nitride, such that a silicon nitride layer can cover the top surface of the stack structure in the core array region as the CMP stop layer to control the endpoint of the CMP process. However, the same silicon nitride layer also covers and protects the topographic dielectric layer outside the stack structure during the CMP. As a result, the step height remains between the down area outside the stack structure and the core array region in the stack structure, which requires additional etching and CMP processes to eliminate it. In practice, a residual step height can even remain in several subsequent processes to cause defects, which affects the production yield.

Moreover, since the layout of structures along different directions (e.g., the word line direction and bit line direction) is different, the different loadings for CMP in different directions may also cause dishing on the top surface of the dielectric layer after CMP in one direction due to over-polishing. The dishing can trap various kinds of residuals in the subsequent deposition processes, which are difficult to remove and also cause defects in the final product.

Besides the various issues caused by the residual step height and dishing after CMP, the removal of the protrusion in the dielectric layer right above the staircase structure during the CMP process introduces additional issues to the conventional CMP process as well. Because the protrusion is also covered by the silicon nitride CMP stop layer, which has a high CMP selectivity over silicon oxide (e.g., ~12), the removal rate is significantly reduced when polishing the protrusion, thereby reducing the throughput and increasing the production cost.

To address the aforementioned issues, the present disclosure introduces a solution in which the conventional CMP process using a high selectivity slurry and a CMP stop layer is replaced with an improved CMP process using an auto-stop slurry (ASS) without any CMP stop layer in polishing dielectric layers, such as the above-mentioned topographic dielectric layer covering the staircase structure in fabricating 3D memory devices. Different from the high selectivity slurry, the endpoint of a CMP process using an auto-stop slurry does not rely on the CMP selectivity over the stop layer, but rather the pressure sensitivity of the slurry as the CMP contact area changes during the process when the surface flatness changes. That is, the surface features remaining on the topography of the dielectric layer can prevent the stop of the CMP process using the auto-stop slurry. As a result, both the residual step height and dishing can be prevented by the CMP process disclosed herein, thereby avoiding the need for extra CMP processes to remove the step height as well as reducing the defects caused by the step height and dishing in later processes. Furthermore, by eliminating the CMP stop layer, the removal rate of the CMP process, in particular when removing protrusions, can be increased to improve the throughput and reduce the cost.

Although the CMP process using an auto-stop slurry is described herein with respect to a dielectric layer covering a staircase structure in a 3D memory device, consistent with the scope of the present disclosure, the CMP process disclosed herein can be applied to any suitable topographic dielectric layers (e.g., having surface features like protrusions, recesses, step heights, etc.) in any suitable semiconductor devices including but not limited to, logic devices (e.g., central processing unit (CPU), graphics processing unit (GPU), and application processor (AP)), volatile memory devices (e.g., dynamic random-access memory (DRAM) and static random-access memory (SRAM)), non-volatile memory devices (e.g., NAND Flash memory, NOR Flash memory), or any combinations thereof in a 2D, 2.5D, or 3D architecture.

Figure 1:
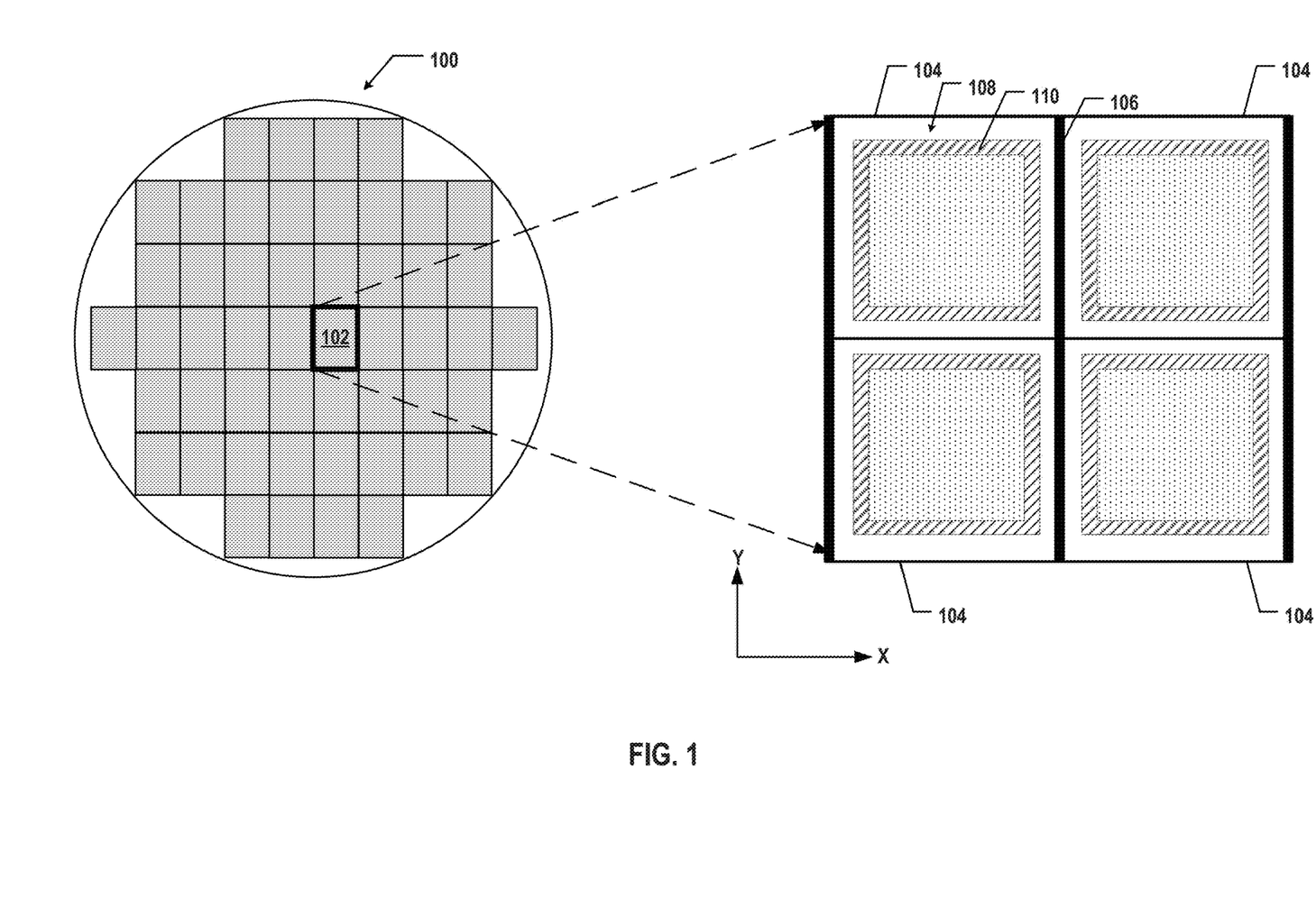
FIG. 1 illustrates a plan view of an exemplary wafer having a plurality of 3D memory device chips, according to some aspects of the present disclosure.

For example, FIG. 1 illustrates a plan view of an exemplary wafer 100 having a plurality of 3D memory device chips 104, according to some aspects of the present disclosure. Wafer 100 can include multiple shots 102 each including four dies, such as four 3D memory device chips 104, separated by scribe lines 106. As shown in FIG. 1, each 3D memory device chip 104 can include a stack structure 108, such as a memory stack having interleaved conductive layers (e.g., gate lines/word lines) and dielectric layers (e.g., gate-to-gate dielectrics), which is elevated from the surrounding down area. In some implementations, stack structure 108 includes a staircase structure 110 on one or more sides of stack structure 108. Staircase structure 110 can have a sloped profile elevating from the surrounding down area outside stack structure 108 to the inner area within stack structure 108. Based on the different elevations of the structures therein, 3D memory device chip 104 can be separated into three regions: a core array region (dot pattern fill), a staircase region (diagonal pattern fill), and a peripheral region (no fill). As shown in FIG. 1, in some implementations, stack structure 108 is in both the core array region and the staircase region, and staircase structure 110 of stack structure 108 is in the staircase region on the side(s) of stack structure 108. Memory cell arrays can be formed in the core array region, for example, in the form of arrays of NAND memory strings each extending vertically through stack structures 108. In some implementations, the peripheral region is the surrounding down area outside stack structure 108. For example, scribe lines 106 may be in the peripheral region. Other protection, testing, or measurement structures, such as seal rings, testing pads, alignment marks, etc., can be in the peripheral region as well.

As described below in detail, in certain stages of fabricating 3D memory device chips 104, the different elevations of the structures in the peripheral region, staircase region, and core array region can cause the formation of a topographic dielectric layer over the peripheral region, staircase region, and core array region, which needs to be planarized (polished), for example, using CMP, to become a planar dielectric layer. For example, the structures in the peripheral region, such as scribe lines 106, may have the lowest elevation, the part of stack structure 108 in the core array region may have the highest elevation, and staircase structure 110 in the staircase region may have a gradually increased elevation from the peripheral region to the core array region. The elevation differences can be cause various surface features in the topography of a deposited dielectric layer, such as protrusions, recesses, and step heights.

The layout of the structures in the peripheral region can be different along different directions as well. For example, as shown in FIG. 1, the thickness of scribe lines 106 along the x-direction (e.g., the word line direction of 3D memory device chips 104) may be greater than the thickness of scribe lines 106 along the y-direction (e.g., the bit line direction of 3D memory device chips 104) perpendicular to the x-direction. As described above, the uneven layout of structures in the x- and y-directions can cause uneven loadings for a CMP process. For example, the same CMP condition may be suitable for patterns in one direction while causing over-polishing for patterns in another direction due to the different loadings between the two directions.

Figure 5:
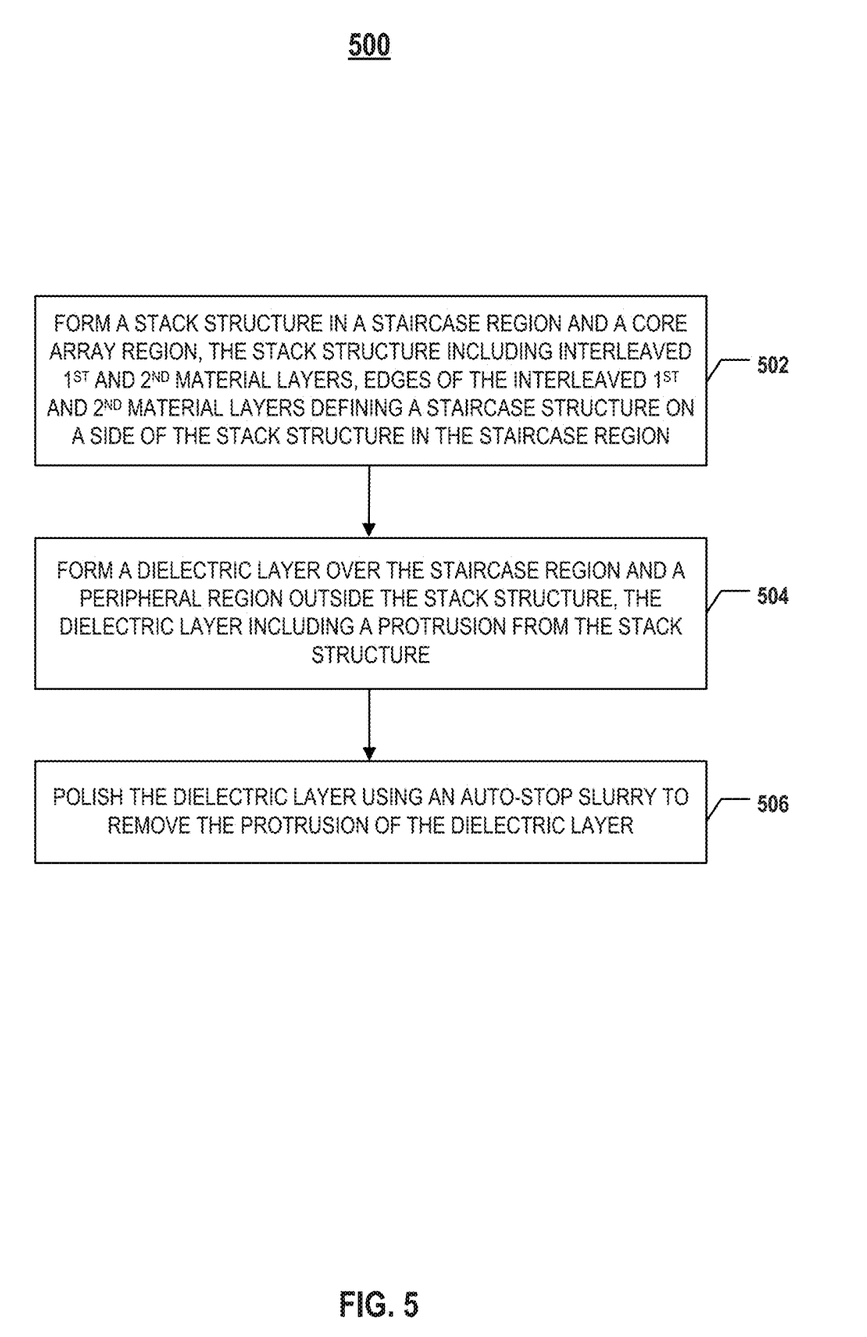
FIG. 5 is a flowchart of an exemplary method for forming a 3D memory device, according to some aspects of the present disclosure.

FIGS. 2A-2H illustrate an exemplary fabrication process for forming a 3D memory device, according to some aspects of the present disclosure. FIG. 5 is a flowchart of an exemplary method 500 for forming a 3D memory device, according to some aspects of the present disclosure. FIGS. 2A-2H and 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

In some implementations, the 3D memory device formed by the exemplary fabrication process depicted in FIGS. 2A-2H and 5 is an example of 3D memory device chips 104 in FIG. 1, and the exemplary fabrication process includes an example of a polishing process, e.g., CMP using an auto-stop slurry, for polishing a dielectric layer that covers the peripheral region, staircase region, and core array region, as described above with respect to FIG. 1. It is understood that the exemplary polishing process may be applied to the fabrication processes for any other suitable semiconductor devices that involve polishing a dielectric layer that is over both an elevated semiconductor structure and a down area outside and below the elevated semiconductor structure.

Referring to FIG. 5, method 500 starts at operation 502, in which a stack structure is formed in a staircase region and a core array region. The stack structure can include a plurality of interleaved first material layers and second material layers. Edges of the interleaved first material layers and second material layers can define a staircase structure on a side of the stack structure in the staircase region. In some implementations, the first material layers include silicon oxide, and the second material layers include silicon nitride.

Figure 2A:
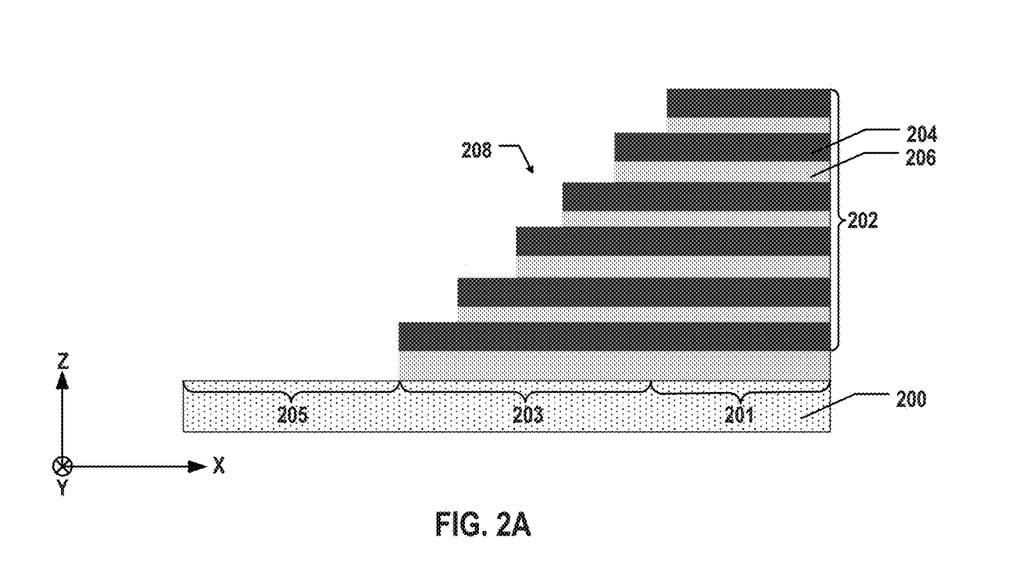
FIGS. 2A-2H illustrate an exemplary fabrication process for forming a 3D memory device, according to some aspects of the present disclosure.

As illustrated in FIG. 2A, a stack structure 202 (e.g., one example of stack structure 108 in FIG. 1) including a plurality pairs of first material layers 206 and second material layers 204 is formed above a substrate 200. That is, stack structure 202 includes vertically interleaved first and second material layers 206 and 204, according to some implementations. First material layers 206 and the second material layers 204 can be alternatingly deposited above substrate 200 to form stack structure 202 using one or more thin film deposition processes including, but not limited to, chemical vapor deposition (CVD), physical vapor deposition (PVD), atomic layer deposition (ALD), or any combination thereof.

It is noted that x, y, and z axes are included in FIGS. 2A-2H to help illustrating the spatial relationship of the components in the 3D memory device. Like in FIG. 1, x and y axes are included in FIGS. 2A-2H to illustrate two perpendicular lateral directions in the wafer plane: the x-direction is the word line direction of the 3D memory device, and the y-direction is the bit line direction of 3D memory device. Substrate 200 of the 3D memory device includes two lateral surfaces extending laterally in the x-y plane: a top surface on the front side of the wafer on which the 3D memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to substrate 200 of the 3D memory device in the z-direction (the vertical direction perpendicular to the x-y plane) when substrate 200 is positioned in the lowest plane of the 3D memory device in the z-direction. The same notion for describing the spatial relationships is applied throughout the present disclosure.

In some implementations, stack structure 202 is a dielectric stack in which first material layers 206 include first dielectric layers, and second material layers 204 (a.k.a. sacrificial layers) include second dielectric layers different from the first dielectric layers. The dielectric layers can include dielectric materials including, but not limited to, silicon oxide, silicon nitride, silicon oxynitride, high dielectric constant (high-k) dielectrics, or any combination thereof. For example, first material layers 206 may include silicon oxide, and second material layers 204 may include silicon nitride. In some implementations, stack structure 202 is a memory stack in which first material layers 206 include dielectric layers, and second material layers 204 include conductive layers. The conductive layers can include conductive materials including, but not limited to, tungsten (W), cobalt (Co), copper (Cu), aluminum (Al), polycrystalline silicon (polysilicon), doped silicon, silicides, or any combination thereof. For example, first material layers 206 may include silicon oxide, and second material layers 204 may include metals (e.g., W) or polysilicon.

As illustrated in FIG. 2A, a staircase structure 208 (e.g., one example of staircase structure 110 in FIG. 1) having a terraced slope-like shape is formed on one side of stack structure 202 for purposes such as word line fan-out. In other words, the edges of interleaved first material layers 206 and second material layers 204 can define staircase structure 208 on the side of stack structure 202. It is understood that in some examples, additionally or alternatively, staircase structure 208 may be formed in the intermediate (e.g., the center) of stack structure 202. Each stair (a.k.a. level) of staircase structure 208 can include one or more pairs of first and second material layers 206 and 204. That is, the height of each stair can be equal to the total thickness of one or more pairs of first and second material layers 206 and 204.

Staircase structure 208 can be formed by a so-called trim-etch process, which, in each cycle, trims (e.g., etching incrementally and inwardly, often from all directions) a patterned photoresist layer, followed by etching the exposed portions of interleaved first material layers 206 and second material layers 204 of stack structure 202 using the trimmed photoresist layer as an etch mask to form one stair of staircase structure 208. The process can be repeated until all the stairs of staircase structure 208 are formed.

As illustrated in FIG. 2A, the 3D memory device can include a core array region 201, a peripheral region 205, and a staircase region 203 laterally between core array region 201 and peripheral region 205. Core array region 201, peripheral region 205, and staircase region 203 may be examples of the core array region, peripheral region, and staircase region in FIG. 1, respectively. In some implementations, stack structure 202 is formed in both core array region 201 and staircase region 203, and staircase structure 208 is formed on the side of stack structure 202 in staircase region 203. In some implementations, a scribe line (not shown) is formed in peripheral region 205 outside stack structure 202. At the fabrication stage in FIG. 2A, the structure in core array region 201 (e.g., part of stack structure 202) can have the highest height (the elevation relative to substrate 200), the structure in peripheral region 205 (e.g., the scribe line) can have the lowest height, and the structure in staircase structure (e.g., staircase structure 208) can have a terraced slope with a gradually increased height from peripheral region 205 to core array region 201, which is formed by the trim-etch process.

That is, the formation of elevated stack structure 202 and sloped staircase structure 208 can cause uneven height distribution among core array region 201, peripheral region 205, and staircase region 203. As the number of levels of stack structure 202 continues increasing to increase the memory cell density, the height changes among core array region 201, peripheral region 205, and staircase region 203 can become more drastic. As a result, following the formation of staircase structure 208 (i.e., the sloped side of stack structure 202), a planar dielectric layer needs to be formed over core array region 201, peripheral region 205, and staircase region 203 in order to provide insulation as well as padding with a flat top surface for subsequent processes.

Figure 6:
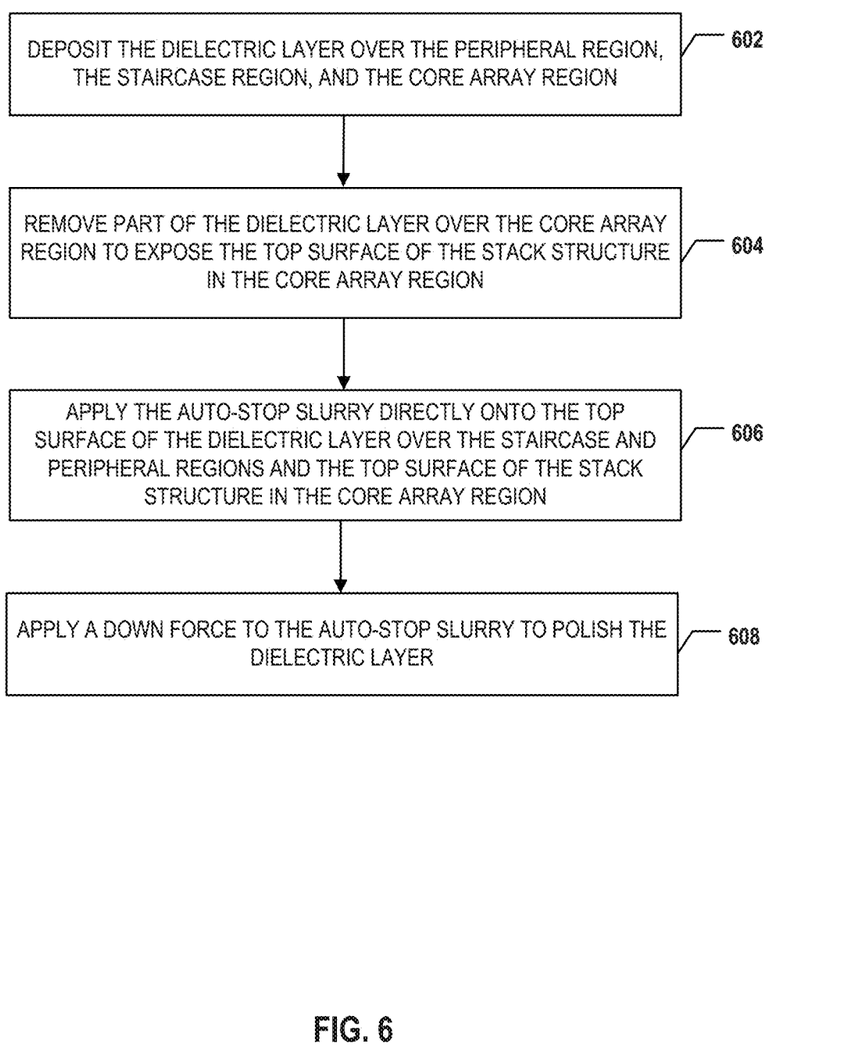
FIG. 6 is a detailed flowchart of the exemplary method for forming a 3D memory device in FIG. 5, according to some aspects of the present disclosure.

Method 500 proceeds to operation 504, as illustrated in FIG. 5, in which a dielectric layer is formed over the staircase region and a peripheral region outside the stack structure. The dielectric layer can include a protrusion from the stack structure. The protrusion can be right above the staircase structure. In some implementations as shown in FIG. 6, to form the dielectric layer, at operation 602, the dielectric layer is deposited over the peripheral region, the staircase region, and the core array region; at operation 604, part of the dielectric layer over the core array region is removed to expose a top surface of the stack structure in the core array region, such that a top surface of the dielectric layer over the peripheral region is above the top surface of the stack structure in the core array region. In some implementations, the top surface of the dielectric layer over the staircase region also protrudes from the peripheral region and the core array region after removing the part of the dielectric layer over the core array region. That is, the topography of the dielectric layer can include a protrusion right above the sloped side of the stack structure, and a step height above the top surface of the stack structure.

Figure 2B:
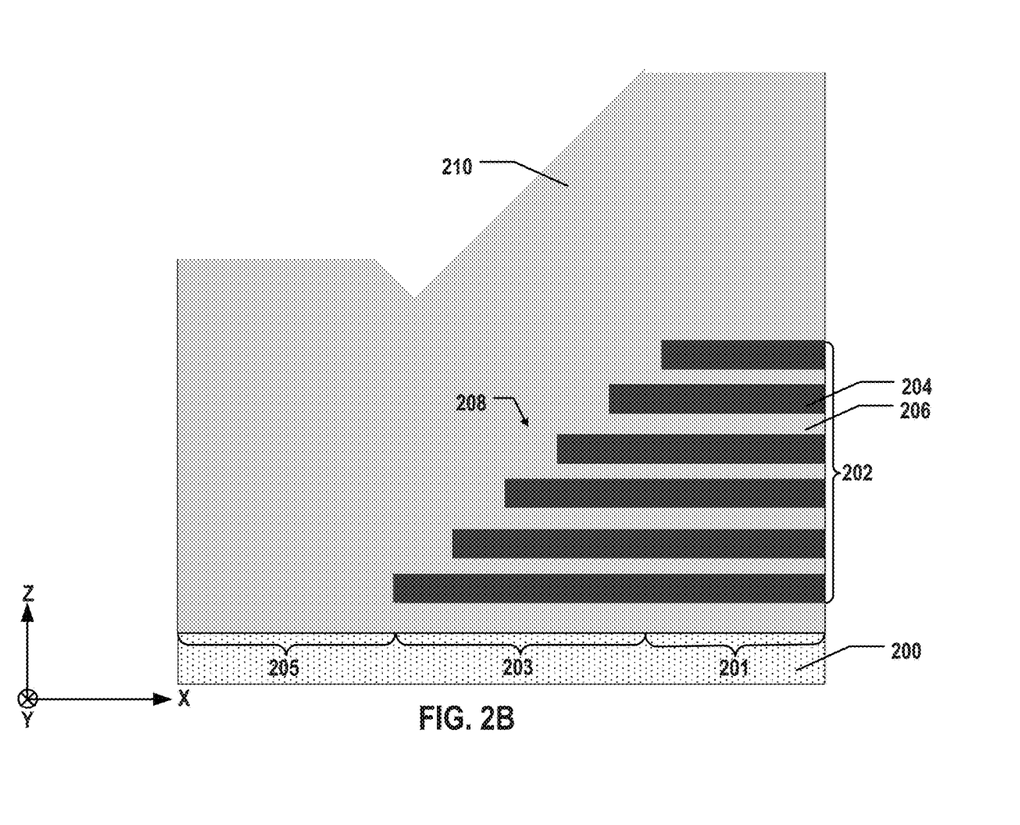

As illustrated in FIG. 2B, a dielectric layer 210 is deposited over peripheral region 205, core array region 201, and staircase region 203 between peripheral region 205 and core array region 201. Dielectric layer 210 can include dielectric materials including, but not limited to, silicon oxide, silicon nitride, silicon oxynitride, or any combination thereof. For example, dielectric layer 210 may include TEOS silicon oxide. Dielectric layer 210 can be deposited using one or more thin film deposition processes including, but not limited to ALD, CVD, PVD, or any combination thereof. The thickness of dielectric layer 210 after deposition is controlled, for example, by controlling the deposition rate and/or time, such that the top surface of dielectric layer 210 is not lower than the top surface of stack structure 202 in core array region 201, according to some implementations. As shown in FIG. 2B, the topography of dielectric layer 210 after deposition can generally follow the height profile of the structures in peripheral region 205, core array region 201, and staircase region 203. That is, the top surface of dielectric layer 210 is elevated from peripheral region 205 through staircase region 203 to core array region 201 after deposition, according to some implementation. In some implementations, to ensure full coverage of dielectric layer 210 over staircase structure 208, which protects second material layers 204 (e.g., silicon nitride, polysilicon, or metals) in later processes, the top surface of dielectric layer 210 over peripheral region 205 is higher than the top surface of stack structure 202 in core array region 201, as shown in FIG. 2B.

Figure 2C:
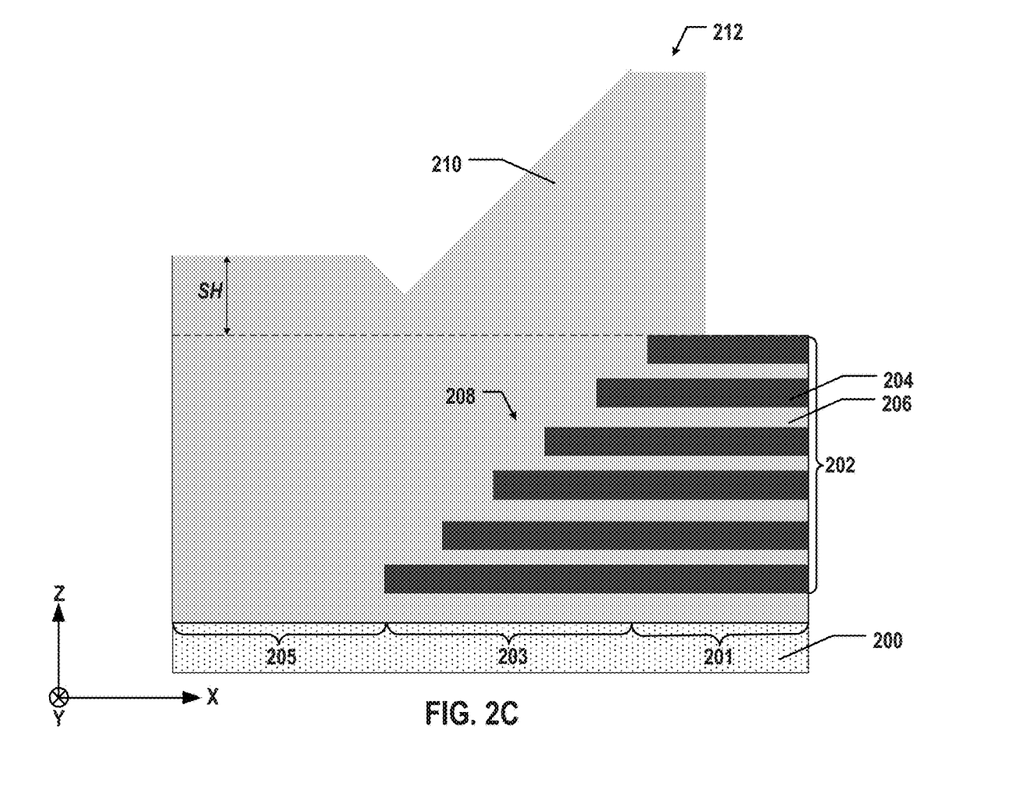

As illustrated in FIG. 2C, part of dielectric layer 210 that is over core array region 201 is removed to expose the top surface of stack structure 202 in core array region 201, for example, the topmost second material layer 204. In some implementations, dielectric layer 210 includes silicon oxide, and each second material layer 204 (including the exposed topmost second material layer 204) includes silicon nitride. To remove the part of dielectric layer 210 over core array region 201, an etch mask (e.g., a photoresist layer, not shown) can be first patterned using lithography to cover the rest of dielectric layer 210 (e.g., the parts over peripheral and staircase regions 205 and 203) and expose only the part that is over core array region 201. An etching process, including dry etching and/or wet etching such as reactive ion etching (RIE), can be used to etch the part of dielectric layer 210 over core array region 201, which is not covered by the etch mask, until reaching the top surface of stack structure 202 in core array region 201 (e.g., the topmost second material layer 204).

The etching process can create the topographic dielectric layer 210, as shown in FIG. 2C. The topography of dielectric layer 210 after etching can include a protrusion 212 right above staircase structure 208 in staircase region 203. In other words, the top surface of dielectric layer 210 over staircase region 203 protrudes from peripheral region 205 and stack structure 202 in core array region 201 after removing the part of dielectric layer 210 over core array region 201, according to some implementation. In some implementations, the slope of protrusion 212 follows the sloped profile of staircase structure 208 due to the conformal coating of dielectric layer 210 over staircase structure 208 using CVD or ALD. For example, the size of protrusion 212 in the x-y plane (i.e., the lateral cross-section area) may gradually increase towards substrate 200. The topography of dielectric layer 210 after etching can also include a step height (SH) between the part of the top surface of dielectric layer 210 that is over peripheral region 205 and the exposed top surface of stack structure 202 in core array region 201. For example, as shown in FIG. 2C, the step height may be above the exposed top surface of stack structure 202 in core array region 201, meaning that the part of the top surface of dielectric layer 210 over peripheral region 205 is higher than the top surface of stack structure 202 in core array region 201 (e.g., the topmost second material layer 204). As described above, the step height can ensure full coverage of dielectric layer 210 over staircase structure 208, which protects second material layers 204 (e.g., silicon nitride, polysilicon, or metals) in later processes.

As described above, the surface features (e.g., protrusion 212 and the step height) of topographic dielectric layer 210 need to be removed by a polishing process, such as CMP, to have a planar top surface of dielectric layer 210 that is flush with the top surface of stack structure 202 on which other structures can be formed in subsequent processes. Different from the conventional polishing process that requires a stop layer (e.g., a silicon nitride layer) formed directly on dielectric layer 210 and a high selectivity slurry, a stop layer-free polishing process can be applied using an auto-stop slurry as described below in detail.

Method 500 proceeds to operation 506, as illustrated in FIG. 5, in which the dielectric layer is polished using an auto-stop slurry to remove the protrusion of the dielectric layer. In some implementations, the dielectric layer is polished using the auto-stop slurry until the protrusion and the step height of the topography of the dielectric layer are flattened. The auto-stop slurry can include an abrasive, an additive, and an inhibitor sensitive to pressure. In some implementations as shown in FIG. 6, to polish the dielectric layer, at operation 606, the auto-stop slurry is applied directly onto the top surfaces of the dielectric layer over the staircase region and the peripheral region as well as the top surface of the stack structure in the core array region; at operation 608, a down force is applied to the auto-stop slurry to polish the dielectric layer. For example, the down force may be applied constantly at a same value. In some implementations, to apply the down force to the auto-stop slurry, the down force is applied to the auto-stop slurry directly on the top surface of the dielectric layer to remove the protruded dielectric layer (protrusion), and the down force is further continuously applied to the auto-stop slurry directly on the top surface of the dielectric layer until the top surface of the dielectric layer is flush with the top surface of the stack structure in the core array region.

Figure 2D:
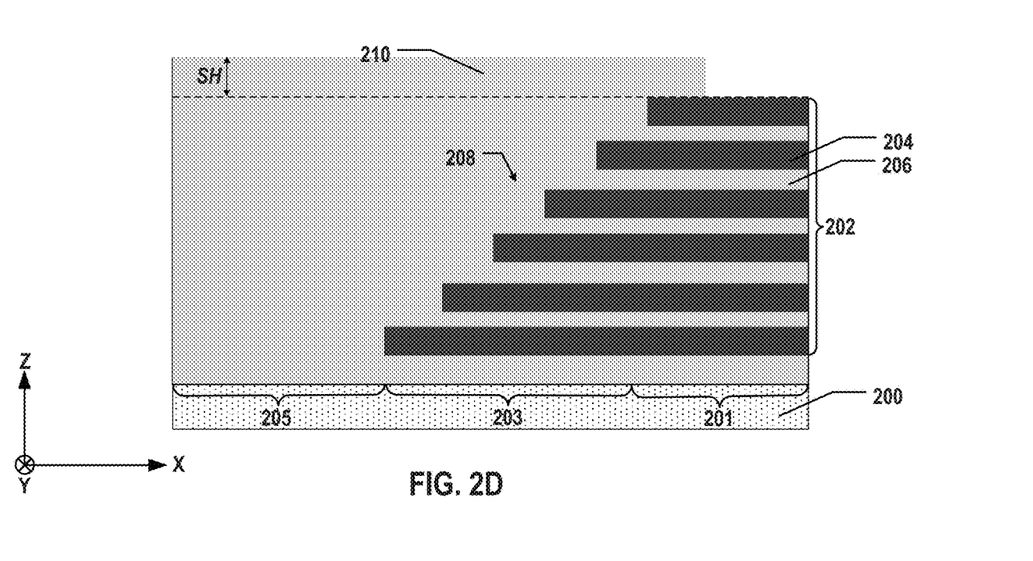
Figure 2E:
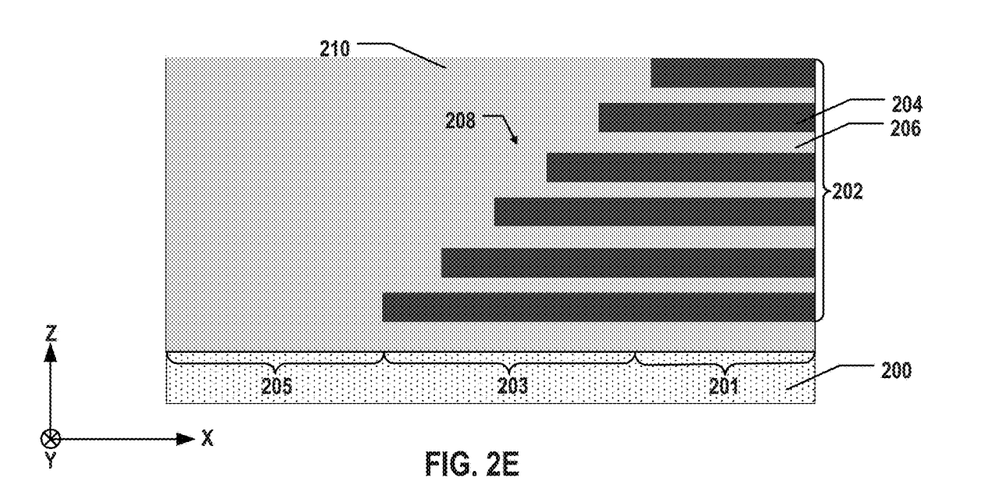

As illustrated in FIG. 2D, protrusion 212 (shown in FIG. 2C) of dielectric layer 210 is removed by polishing topographic dielectric layer 210 using an auto-stop slurry in a CMP process. The step height can be reduced as well. That is, the top surface of dielectric layer 210 over peripheral region 205 can be lowered by polishing dielectric layer 210 using the auto-stop slurry. As illustrated in FIG. 2E, dielectric layer 210 is continuously polished until the step height is removed, i.e., when the top surface of dielectric layer 210 over peripheral region 205 and staircase region 203 is planar and flush with the top surface of stack structure 201 in core array region 201. In other words, protrusion 212 and the step height of the topography of dielectric layer 210 are flattened after polishing, as shown in FIG. 2E, according to some implementations.

Different from the conventional CMP process for polishing dielectric layer 210, which first forms a CMP stop layer (e.g., a silicon nitride layer) directly on dielectric layer 210 prior to polishing, the CMP process disclosed herein is applied directly to dielectric layer 210 without a stop layer formed thereon, i.e., being a stop layer-free CMP process or an auto-stop CMP process in the presence of an auto-stop slurry, according to some implementations. The term "auto-stop" disclosed herein refers to that once the up areas on a topographic dielectric layer have been removed by a polishing process (e.g., CMP) such that they are in the same plane as the down areas, the removal rate (RR) across the planar top surface of the dielectric becomes zero to essentially stop the polishing process. Thus, polishing beyond the endpoint (i.e., over-polishing) does not continue thinning the dielectric layer. The endpoint detection and maintenance are thus not per se critical to obtain a planar dielectric layer of the desired thickness.

An auto-stop slurry can include an abrasive, an additive, and an inhibitor sensitive to pressure. By adding the inhibitor that is sensitive to pressure to the additive, the inhibitor that adheres to the surface of abrasives can cause a higher removal rate to a topographic surface, but a lower removal rate to a planar (flat or blanket) surface. Thus, as the surface features of the topography being flatten, the removal rate decreases and eventually becomes zero to essentially stop the polishing process. In some implementations in which the dielectric layer includes silicon oxide, the abrasive (a.k.a. polishing agent) is ceria (cerium oxide, $CeO_2$)-based abrasive. It is understood that in some examples, the abrasive may include other metal oxide materials, such as zinc oxide ($ZrO_2$), thorium oxide ($ThO_2$), titanium oxide ($TiO_2$), iron oxide ($Fe_2O_3$), aluminum oxide ($Al_2O_3$), etc. The abrasives can be suspended in an aqueous solution (commonly a colloid), such as alkaline or any other suitable solution, with various additives for different purposes, such as rust prevention, metal protection, pH control, stop layer passivation, and so on. For example, in a high selectivity slurry, additives (e.g., surfactants) may have a high silicon nitride selectivity over silicon oxide (e.g., greater than 10) to be more easily adhere to a silicon nitride layer than a silicon oxide layer to passivate the silicon nitride stop layer.

Figure 3A:
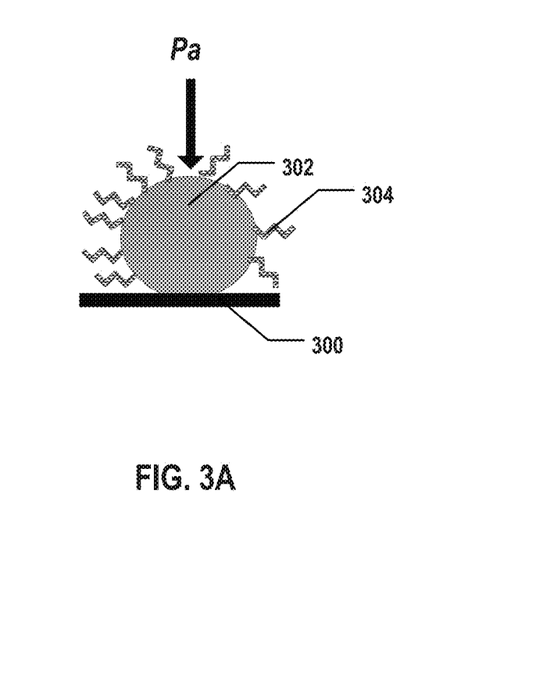
FIGS. 3A and 3B illustrate the polishing mechanism of an exemplary auto-stop slurry, according to some aspects of the present disclosure.
Figure 3B:
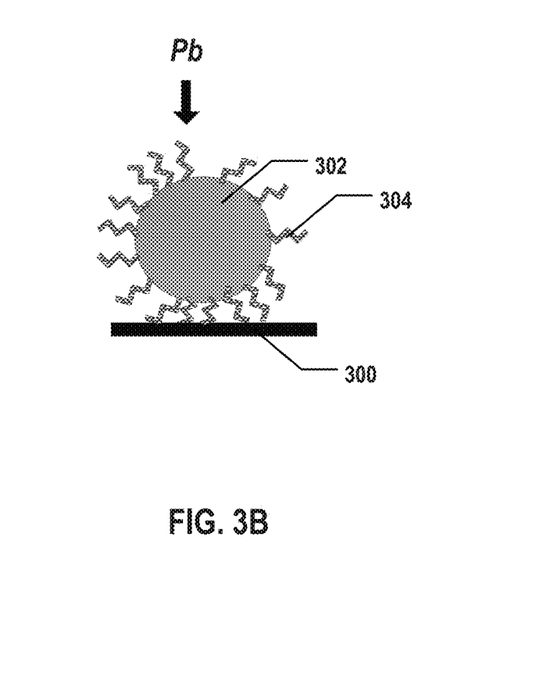

In an auto-stop slurry, an inhibitor sensitive to pressure (a.k.a. self-stop agent) can be added, such that the slurry can react sensitively to the polishing pressure. In some implementations, the inhibitor includes benzotriazole ($C_6H_5N_3$, a.k.a. BTA), hydrogen phthalate salt, or polyalkylamine, for example, polyethyleneimine (a.k.a. PEI). For example, FIGS. 3A and 3B illustrate the polishing mechanism of an exemplary auto-stop slurry, according to some aspects of the present disclosure. The auto-stop slurry may include an abrasive 302 (e.g., ceria particles), a pressure-sensitive inhibitor 304, and other additives (not shown). The auto-stop slurry may be applied directly onto a dielectric layer 300 (e.g., a silicon oxide layer) without any stop layer (e.g., a silicon nitride layer) therebetween. A down force (DF) then may be applied to the auto-stop slurry to generate a pressure P, which is defined by the down force and the contact area between the CMP pad and the polishing surface of dielectric layer 300 in contact with the CMP pad. In FIG. 3A, when pressure $P_a$ is relatively high, inhibitors 304 between abrasives 302 and dielectric layer 300 may be pushed away from abrasives 302 by high-pressure $P_a$, resulting in a high removal rate of dielectric layer 300. In contrast, in FIG. 3B when pressure Pb is relatively low, inhibitors 304 adhere back to abrasives 302 to prevent abrasives 302 from contacting dielectric layer 300, resulting in a low removal rate of dielectric layer 300.

Figure 4:
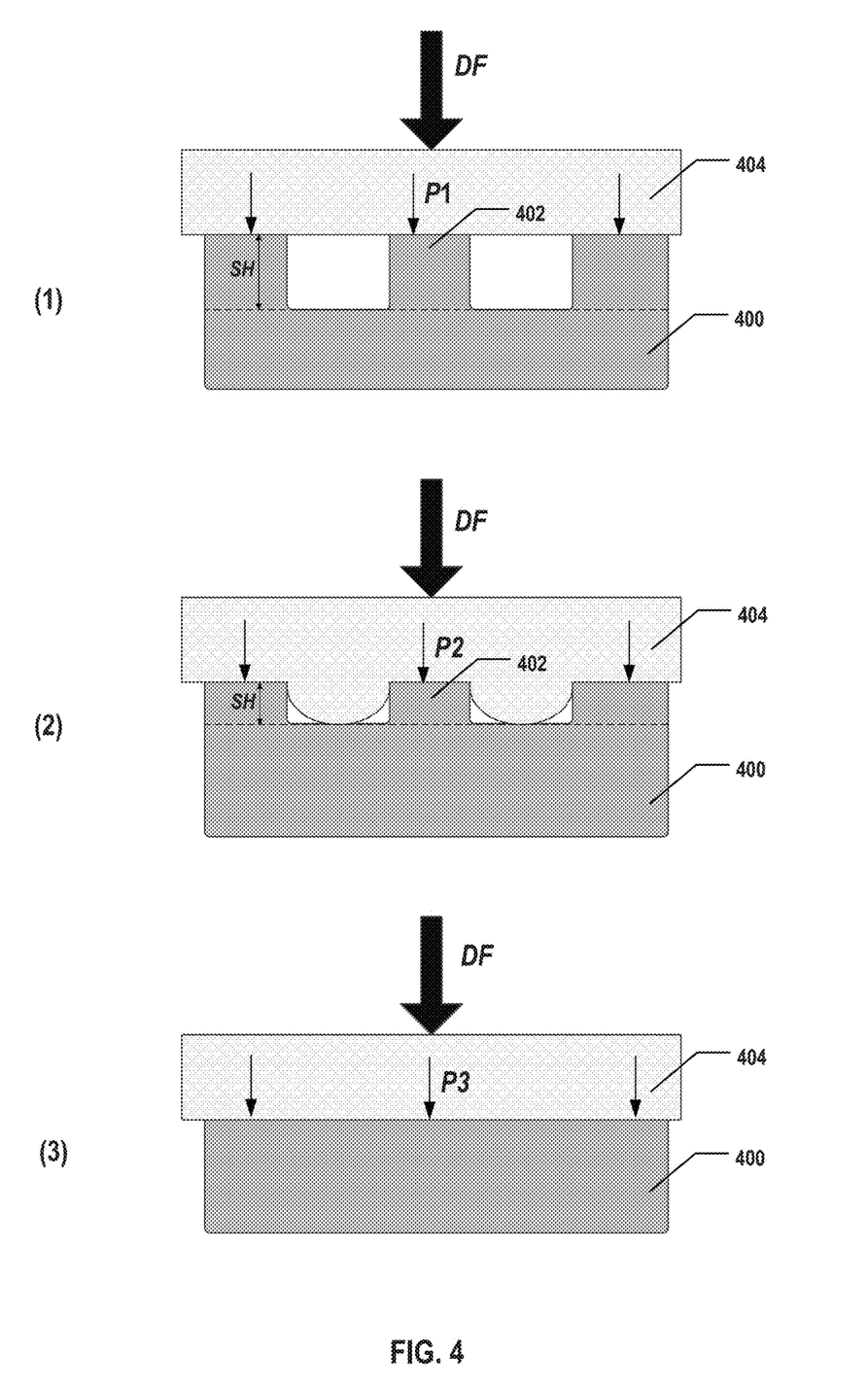
FIG. 4 illustrates an exemplary polishing process using an auto-stop slurry, according to some aspects of the present disclosure.

That is, by adding an inhibitor sensitive to pressure to the auto-stop slurry, the removal rate of the CMP process can be self-adjusted based on the pressure applied to the auto-stop slurry. In some implementations, when the down force is applied constantly at the same value, the removal rate of the CMP process is affected only by the contact area, for example, the topography of the dielectric layer. FIG. 4 illustrates an exemplary polishing process using an auto-stop slurry, according to some aspects of the present disclosure. At stage (1) in FIG. 4, an auto-stop slurry (not shown) may be applied between a topographic dielectric layer 400 and a CMP pad 404. The topography of dielectric layer 400 may include protrusions 402 and step heights (SH). A down force (DF) may then be applied to the auto-stop slurry through CMP pad 404 to generate a pressure P1 to start polishing topographic dielectric layer 400. Continuing to stage (2), the polishing of topographic dielectric layer 400 may change the topography of dielectric layer 400, for example, by removing parts of protrusions 402 and reducing the step heights, resulting in an increase of the contact area between CMP pad 404 and dielectric layer 400. The same down force may be constantly applied between stage (1) and (2). Thus, pressure P2 at stage (2) may decrease due to the increase of the contact area from stage (1). As described above, the decrease of the pressure may cause a decrease of the removal rate from stage (1). Continuing to stage (3), when the topography of dielectric layer 400 is flatten by removing protrusions 402 and the step heights (i.e., when topographic dielectric layer 400 becomes planar dielectric layer 400), the auto-stop slurry may be formulated based on current pressure P3 with the same down force, such that the removal rate of polishing becomes zero to essentially stop the polishing automatically.

Referring back to FIGS. 2C-2E, similarly, the removal rate of polishing may decrease as protrusion 212 of dielectric layer 210 being removed due to the increase of the polishing contact area. By adjusting the composition of the auto-stop slurry, for example, the type and/or weight concentration of the pressure-sensitive inhibitor, the removal rate of the polishing may become zero, i.e., essentially stopping the polishing, when the top surface of dielectric layer 210 becomes planar and flush with the top surface of stack structure 202, as shown in FIG. 2E. In some implementations, the auto-stop slurry also exhibits the CMP stopping behavior as a high selectivity slurry as well, for example, by adding the high selectivity additive, such as surfactants, into the auto-stop slurry. The auto-stop slurry with high selectivity additive can thus be applied directly onto the top surface of dielectric layer 210 over peripheral and staircase regions 205 and 203 as well as onto the top surface of stack structure 202, i.e., the topmost second material layer 204. As a result, the polishing not only stops at the planar top surface of dielectric layer 210 (e.g., a silicon oxide layer), but also stops at the second material layer 204 (e.g., a silicon nitride layer), which functions as a CMP stop layer. In some implementations, the down force is constantly applied at the same value through the polishing process, and the polishing time is controlled to be sufficient to reach the endpoint at which the removal rate becomes zero. It is understood that excess polishing time beyond the endpoint would not further thin the planar dielectric layer 210 to cause over-polishing due to the auto-stop nature of the auto-stop slurry.

By utilizing the auto-stop nature of the auto-stop slurry in the polishing process, the various issues involved in the conventional dielectric layer polishing process as described above can be overcome. Regarding the residual step height, since any residual step height (e.g., shown in FIG. 2D) prior to the polishing endpoint (e.g., shown in FIG. 2E) would cause the removal rate higher than zero, the polishing can continue until reaching the endpoint, i.e., when all the surface features, including residual step height, were removed from the topography of dielectric layer 210. As described above, the auto-stop nature of the auto-stop slurry would also prevent over-polishing, such that the dishing due to unbalanced loadings along different directions can be avoided as well. Moreover, as the CMP stop layer does not form on dielectric layer 210, including protrusion 212, the removal of dielectric layer 210, in particular, protrusion 212, the throughput of the polishing process can be increased with a reduction of the manufacturing cost.

The improvement of the surface flatness of dielectric layer 210 after polishing can also avoid potential defects in subsequent processes. For illustrative purposes only without limiting the applications of the polishing process disclosed herein, exemplary processes in fabricating the 3D memory after the polishing process are described below.

Figure 2F:
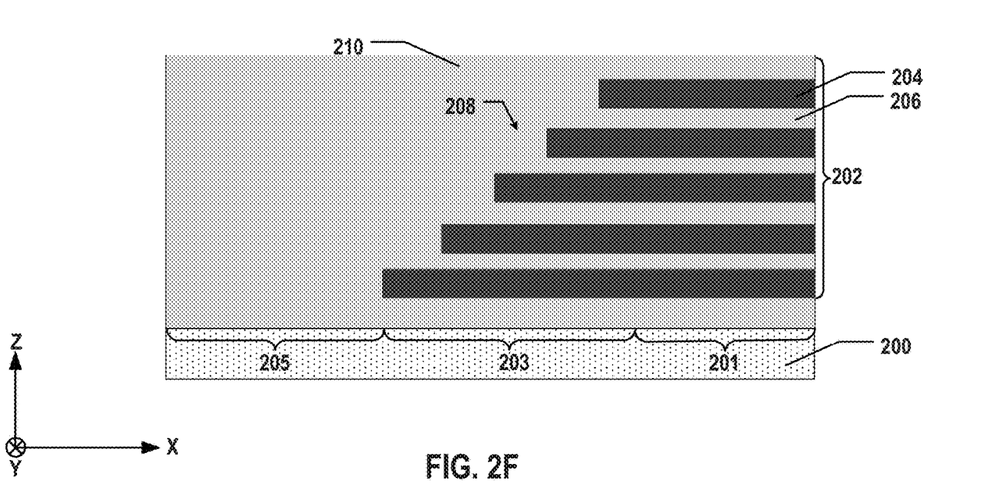

As illustrated in FIG. 2F, the topmost second material layer 204 (e.g., a silicon nitride layer) is removed, followed by polishing dielectric layer 210, such that the top surface of dielectric layer 210 (e.g., a silicon oxide layer) is flush with the top surface of stack structure 202, i.e., the topmost first material layer 206 (e.g., a silicon oxide layer). The prior polishing process may damage the top surface of the topmost second material layer 204, which serves as the CMP stop layer protecting stack structure 202 during the polishing process. Thus, in some implementations, to avoid any defects on the topmost second material layer 204, an etching process, such as a wet etching process selective to silicon nitride over silicon oxide, is applied to selectively remove the topmost second material layer 204 without etching dielectric layer 210 and first material layers 206. Another polishing process, such as a CMP process with a much shorter duration, can then be applied to planarize dielectric layer 210 to be flush with the exposed topmost first material layer 206. The polishing process can use the auto-stop slurry as well. As a result, a damage-free, planar silicon oxide layer (including dielectric layer 210 and the topmost first material layer 206) can be formed over peripheral region 205, staircase region 203, and core array region 201. Compared with the conventional polishing process, no additional operations may be needed to remove the residual step height (e.g., etching part of dielectric layer 210 over peripheral region 205) or fill up the dishing (depositing another buffer layer on dielectric layer 210) caused by the prior polishing process in order to form the damage-free, planar silicon oxide layer, as shown in FIG. 2F.

Figure 2G:
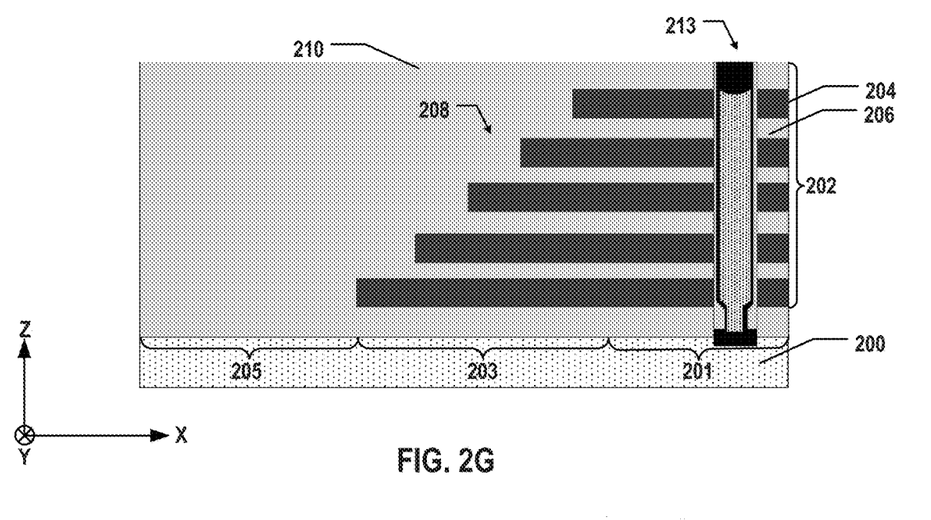

As illustrated in FIG. 2G, an array of NAND memory strings 213 are formed in core array region 201. Each NAND memory string 213 can extend vertically through stack structure 202 into substrate 200. In some implementations, the fabrication process to form NAND memory string 213 includes forming a channel hole through stack structure 202 using dry etching/and or wet etching, such as deep RIE (DRIE), followed by filling the channel hole with a plurality of layers, such as a memory film and a semiconductor channel, using thin film deposition processes. For example, the memory film may be a composite dielectric layer, such as a combination of multiple dielectric layers including, but not limited to, a blocking layer, a storage layer, and a tunneling layer. The memory film and semiconductor channel can be formed by sequentially depositing a plurality of layers, such as a silicon oxide layer, a silicon nitride layer, a silicon oxide layer, and a polysilicon layer using one or more thin film deposition processes including, but not limited to ALD, CVD, PVD, or any combination thereof. The remaining space of the channel hole may be filled with a capping layer by depositing silicon oxide into the channel hole. In some implementations, a channel plug is formed in the top portion of the channel hole, for example, by etching back the semiconductor channel using dry etching and/or wet etching to form a recess and filling the recess with polysilicon using one or more thin film deposition processes including, but not limited to ALD, CVD, PVD, or any combination thereof. In the fabrication process to form NAND memory string 213, a damage-free, planar silicon oxide layer (including dielectric layer 210 and the topmost first material layer 206) can avoid any residual, such as polysilicon residual trapped by the dishing, which may occur after the conventional polishing process described above.

Figure 2H:
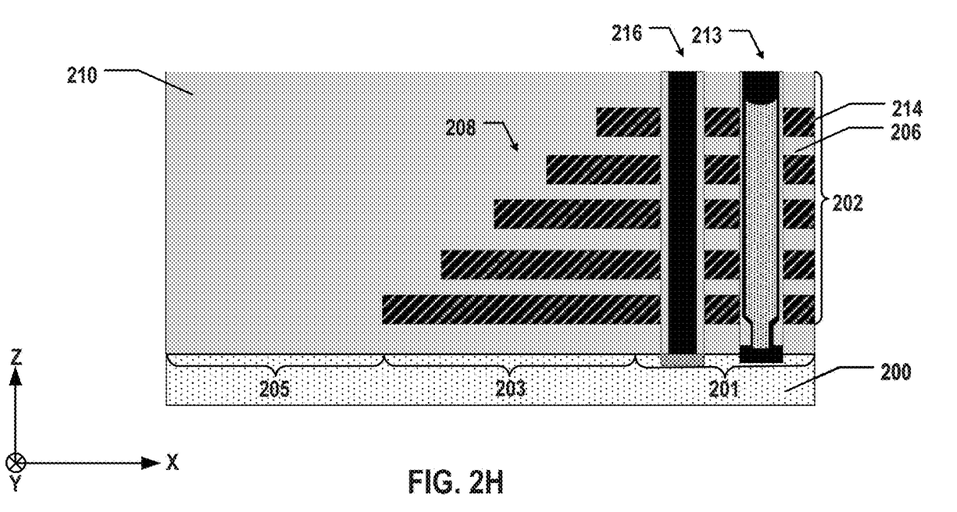

As illustrated in FIG. 2H, in some implementations in which second material layers 204 include dielectric layers, such as silicon nitride, a so-called gate replacement process is performed to replace second material layers 204 with third material layers 214 including conductive materials, such as W. For example, a slit may be are etched through stack structure 202 using wet etching and/or dry etching, such as DRIE, which may serve as the passageways for the gate replacement process. The replacement of second material layers 204 with third material layers 214 can be performed by wet etching second material layers 204 (e.g., silicon nitride) selective to first material layers 206 (e.g., silicon oxide) and filling the resulting lateral recesses with third material layers 214 (e.g., W). Third material layers 214 can be deposited using one or more thin film deposition processes including, but not limited to ALD, CVD, PVD, or any combination thereof.

As illustrated in FIG. 2H, in some implementations, a source contact structure 216 is formed through stack structure 202 in core array region 201. Source contact structure 216 can be formed by sequentially depositing one or more dielectric layers (e.g., silicon oxide, as a spacer) and one or more conductive layers (e.g., W and polysilicon, as a contact) into the slit using one or more thin film deposition processes including, but not limited to ALD, CVD, PVD, or any combination thereof. Again, in the fabrication process to form source contact structure 216, a damage-free, planar silicon oxide layer (including dielectric layer 210 and the topmost first material layer 206) can avoid any residual, such as W residual or polysilicon residual trapped by the dishing, which may occur after the conventional polishing process described above.

Although the CMP process using an auto-stop slurry is described above with respect to a dielectric layer covering a staircase structure in a 3D memory device, consistent with the scope of the present disclosure, the CMP process disclosed herein can be applied to any suitable topographic dielectric layers (e.g., having surface features like protrusions, recesses, step heights, etc.) in any suitable semiconductor devices including but not limited to, any suitable logic devices, volatile memory devices, non-volatile memory devices, or any combinations thereof. For example, a dielectric layer (e.g., dielectric layer 210) may be deposited over a semiconductor structure (e.g., stack structure 202), and an area (e.g., peripheral region 205) outside and below the semiconductor structure. The semiconductor structure may be any elevated semiconductor structure relative to the outside down area. A side of the semiconductor structure may be sloped (e.g., staircase structure 208). Part of the dielectric layer may then be removed to expose a planar top surface of the semiconductor structure, such that a topography of the dielectric layer includes a protrusion (e.g., protrusion 212) right above the sloped side of the semiconductor structure, and a step height above the top surface of the semiconductor structure. The step height may be between the part of the dielectric layer right above the area and the top surface of the semiconductor structure. The dielectric layer may then be polished using an auto-stop slurry until the protrusion and the step height of the topography of the dielectric layer are flattened. To polish the dielectric layer, the auto-stop slurry may be applied directly onto a top surface of the dielectric layer and the top surface of the semiconductor structure, and a down force to the auto-stop slurry directly on the top surfaces of the dielectric layer and the semiconductor structure until the top surface of the dielectric layer is planar and flush with the top surface of the semiconductor structure. The removal rate of the polishing may decrease as the protrusion of the dielectric layer being polished and become zero when the protrusion and the step height of the topography of the dielectric layer are flattened.

According to one aspect of the present disclosure, a method for forming a 3D memory device is disclosed. A stack structure is formed in a staircase region and a core array region. The stack structure includes a plurality of interleaved first material layers and second material layers. Edges of the interleaved first material layers and second material layers define a staircase structure on a side of the stack structure in the staircase region. A dielectric layer is formed over the staircase region and a peripheral region outside the stack structure. The dielectric layer includes a protrusion from the stack structure. The dielectric layer is polished using an auto-stop slurry to remove the protrusion of the dielectric layer.

In some implementations, to form the dielectric layer, the dielectric layer is deposited over the peripheral region, the staircase region, and the core array region, and part of the dielectric layer over the core array region is removed to expose a top surface of the stack structure in the core array region, such that a top surface of the dielectric layer over the peripheral region is above the top surface of the stack structure in the core array region.

In some implementations, the top surface of the dielectric layer over the peripheral region is lowered by polishing the dielectric layer using the auto-stop slurry.

In some implementations, the top surface of the dielectric layer over the peripheral region becomes flush with the top surface of the stack structure in the core array region by polishing the dielectric layer using the auto-stop slurry.

In some implementations, to polish the dielectric layer, the auto-stop slurry is applied directly onto a top surface of the dielectric layer over the staircase region and a top surface of the dielectric layer over the peripheral region, and a down force is applied to the auto-stop slurry directly on the top surfaces of the dielectric layer over the staircase region and the peripheral region.

In some implementations, the down force is applied constantly at a same value.

In some implementations, a removal rate of the polishing becomes zero when the top surfaces of the dielectric layer over the staircase region and peripheral region become flush with a top surface of the stack structure in the core array region.

In some implementations, the protrusion is right above the staircase structure.

In some implementations, a slope of the protrusion of the dielectric layer follows a profile of the staircase structure.

In some implementations, a removal rate of the polishing decreases as the protrusion of the dielectric layer being removed.

In some implementations, a scribe line is in the peripheral region.

In some implementations, the first material layers include silicon oxide, the second material layers include silicon nitride, and the dielectric layer includes silicon oxide. In some implementations, the auto-stop slurry includes a ceria-based abrasive, an additive selective to silicon nitride over silicon oxide, and an inhibitor sensitive to pressure.

According to another aspect of the present disclosure, a method for forming 3D memory device is disclosed. A dielectric layer is formed over a peripheral region, a core array region, and a staircase region between the peripheral region and the core array region, such that a top surface of the dielectric layer is elevated from the peripheral region through the staircase region to the core array region. Part of the dielectric layer over the core array region is removed. An auto-stop slurry is applied directly onto the top surface of the dielectric layer. A down force is applied to the auto-stop slurry directly on the top surface of the dielectric layer to polish the dielectric layer.

In some implementations, the auto-stop slurry includes an abrasive, an additive, and an inhibitor sensitive to pressure.

In some implementations, a stack structure includes a plurality of interleaved first material layers and second material layers and is in the core array region and the staircase region, edges of the interleaved first material layers and second material layers define a staircase structure on a side of the stack structure in the staircase region, and the top surface of the dielectric layer over the staircase region protrudes from the peripheral region and the core array region after removing the part of the dielectric layer over the core array region.

In some implementations, to apply the down force to the auto-stop slurry, the down force is applied to the auto-stop slurry directly on the top surface of the dielectric layer to remove the protruded dielectric layer.

In some implementations, a removal rate of the dielectric layer decreases as the protruded dielectric layer being removed.

In some implementations, to apply the down force to the auto-stop slurry, the down force is further continuously applied to the auto-stop slurry directly on the top surface of the dielectric layer until the top surface of the dielectric layer is flush with a top surface of the stack structure in the core array region.

In some implementations, a removal rate of the dielectric layer becomes zero when the top surface of the dielectric layer becomes flush with the top surface of the stack structure in the core array region.

In some implementations, the down force is applied constantly at a same value.

In some implementations, a scribe line is in the peripheral region.

According to still another aspect of the present disclosure, a method for forming a semiconductor device is disclosed. A dielectric layer is deposited over a semiconductor structure and an area outside and below the semiconductor structure. A side of the semiconductor structure is sloped. Part of the dielectric layer is removed to expose a planar top surface of the semiconductor structure, such that a topography of the dielectric layer includes a protrusion right above the sloped side of the semiconductor structure, and a step height above the top surface of the semiconductor structure. The dielectric layer is polished using an auto-stop slurry until the protrusion and the step height of the topography of the dielectric layer are flattened.

In some implementations, to polish the dielectric layer, the auto-stop slurry is applied directly onto a top surface of the dielectric layer and the top surface of the semiconductor structure, and a down force is applied to the auto-stop slurry directly on the top surfaces of the dielectric layer and the semiconductor structure until the top surface of the dielectric layer is planar and flush with the top surface of the semiconductor structure.

In some implementations, the down force is applied constantly at a same value.

In some implementations, the auto-stop slurry includes an abrasive, an additive, and an inhibitor sensitive to pressure.

In some implementations, the step height is between part of the dielectric layer right above the area and the top surface of the semiconductor structure.

In some implementations, a removal rate of the polishing decreases as the protrusion of the dielectric layer being polished and becomes zero when the protrusion and the step height of the topography of the dielectric layer are flattened.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
    forming a stack structure in a staircase region and a core array region, the stack structure comprising a plurality of interleaved first material layers and second material layers, edges of the interleaved first material layers and second material layers defining a staircase structure on a side of the stack structure in the staircase region;
    forming a dielectric layer over the staircase region, the core array region, and a peripheral region outside the stack structure, the dielectric layer comprising a protrusion from the stack structure;
    removing part of the dielectric layer over the core array region to expose a top surface of the stack structure in the core array region, such that a top surface of the dielectric layer over the peripheral region is above the top surface of the stack structure in the core array region; and
    polishing the dielectric layer using an auto-stop slurry to remove the protrusion of the dielectric layer.

2. The method of claim 1, wherein forming the dielectric layer comprises:
    depositing the dielectric layer over the peripheral region, the staircase region, and the core array region.

3. The method of claim 1, wherein the top surface of the dielectric layer over the peripheral region is lowered by polishing the dielectric layer using the auto-stop slurry.

4. The method of claim 3, wherein the top surface of the dielectric layer over the peripheral region becomes flush with the top surface of the stack structure in the core array region by polishing the dielectric layer using the auto-stop slurry.

5. The method of claim 1, wherein polishing the dielectric layer comprises:
applying the auto-stop slurry directly onto a top surface of the dielectric layer over the staircase region and the top surface of the dielectric layer over the peripheral region; and
applying a down force to the auto-stop slurry directly on the top surfaces of the dielectric layer over the staircase region and the peripheral region.

6. The method of claim 5, wherein the down force is applied constantly at a same value.

7. The method of claim 5, wherein a removal rate of the polishing becomes zero when the top surfaces of the dielectric layer over the staircase region and the peripheral region become flush with a top surface of the stack structure in the core array region.

8. The method of claim 1, wherein the protrusion is right above the staircase structure.

9. The method of claim 8, wherein a slope of the protrusion of the dielectric layer follows a profile of the staircase structure.

10. The method of claim 1, wherein a removal rate of the polishing decreases as the protrusion of the dielectric layer being removed.

11. The method of claim 1, further comprising forming a scribe line in the peripheral region.

12. The method of claim 1, wherein
the first material layers comprise silicon oxide, the second material layers comprise silicon nitride, and the dielectric layer comprises silicon oxide; and
the auto-stop slurry comprises a ceria-based abrasive, an additive selective to silicon nitride over silicon oxide, and an inhibitor sensitive to pressure.

13. A method for forming a three-dimensional (3D) memory device, comprising:
depositing a dielectric layer over a peripheral region, a core array region, and a staircase region between the peripheral region and the core array region, such that a top surface of the dielectric layer is elevated from the peripheral region through the staircase region to the core array region, wherein a stack structure is formed in the core array region and the staircase region;
removing part of the dielectric layer over the core array region to expose a top surface of the stack structure in the core array region, such that a top surface of the dielectric layer over the peripheral region is above the top surface of the stack structure in the core array region;
applying an auto-stop slurry directly onto the top surface of the dielectric layer; and
applying a down force to the auto-stop slurry directly on the top surface of the dielectric layer to polish the dielectric layer.

14. The method of claim 13, wherein the auto-stop slurry comprises an abrasive, an additive, and an inhibitor sensitive to pressure.

15. The method of claim 13, wherein
the stack structure comprises a plurality of interleaved first material layers and second material layers;
edges of the interleaved first material layers and second material layers define a staircase structure on a side of the stack structure in the staircase region; and
the top surface of the dielectric layer over the staircase region protrudes from the peripheral region and the core array region after removing the part of the dielectric layer over the core array region.

16. The method of claim 15, wherein applying the down force to the auto-stop slurry comprises applying the down force to the auto-stop slurry directly on the top surface of the dielectric layer to remove the protruded dielectric layer.

17. The method of claim 16, wherein a removal rate of the dielectric layer decreases as the protruded dielectric layer being removed.

18. The method of claim 16, wherein applying the down force to the auto-stop slurry further comprises continuously applying the down force to the auto-stop slurry directly on the top surface of the dielectric layer until the top surface of the dielectric layer is flush with a top surface of the stack structure in the core array region.

19. The method of claim 18, wherein a removal rate of the dielectric layer becomes zero when the top surface of the dielectric layer becomes flush with the top surface of the stack structure in the core array region.

20. A method for forming a semiconductor device, comprising:
depositing a dielectric layer over a semiconductor structure and an area outside and below the semiconductor structure, wherein a side of the semiconductor structure is sloped;
removing, using an etch mask, part of the dielectric layer to expose a planar top surface of the semiconductor structure, such that a topography of the dielectric layer comprises a protrusion right above the sloped side of the semiconductor structure, and a step height above the top surface of the semiconductor structure; and
polishing the dielectric layer using an auto-stop slurry until the protrusion and the step height of the topography of the dielectric layer are flattened.

* * * * *